(12) United States Patent
Baldwin, Jr. et al.

(10) Patent No.: US 10,219,405 B2
(45) Date of Patent: Feb. 26, 2019

(54) AIRFLOW STRAIGHTENER IN AN ELECTRONICS CHASSIS

(71) Applicant: NATIONAL INSTRUMENTS CORPORATION, Austin, TX (US)

(72) Inventors: Richard G. Baldwin, Jr., Austin, TX (US); Jared S. Harlan, Austin, TX (US); D. Vance Toth, Austin, TX (US)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 0 days.

(21) Appl. No.: 15/645,267

(22) Filed: Jul. 10, 2017

(65) Prior Publication Data

US 2019/0014682 A1     Jan. 10, 2019

(51) Int. Cl.
*G06F 1/20*     (2006.01)
*H05K 7/20*     (2006.01)

(52) U.S. Cl.
CPC ........... *H05K 7/20145* (2013.01); *G06F 1/20* (2013.01); *H05K 7/20727* (2013.01)

(58) Field of Classification Search
CPC ....... H05K 7/20009; H05K 7/20136–7/20145; H05K 7/20181; H05K 7/20554–7/20581; H05K 7/20718–7/20736; F28F 9/0263; F28F 9/0268
See application file for complete search history.

(56) References Cited

U.S. PATENT DOCUMENTS

| | | | | |
|---|---|---|---|---|
| 4,691,274 A * | 9/1987 | Matouk | ..................... | G06F 1/18 165/80.3 |
| 5,606,622 A * | 2/1997 | Christenson | ......... | G10K 11/178 381/71.5 |
| 6,102,501 A * | 8/2000 | Chen | ....................... | G06F 1/181 312/223.2 |
| 6,643,131 B1 * | 11/2003 | Huang | .................. | H01L 23/467 165/121 |
| 6,654,244 B2 * | 11/2003 | Laufer | ............... | H05K 7/20145 165/80.3 |
| 6,912,131 B2 * | 6/2005 | Kabat | ................ | H05K 7/20563 165/104.34 |
| 7,259,961 B2 * | 8/2007 | Lucero | ............... | H05K 7/20563 165/121 |
| 7,355,850 B2 * | 4/2008 | Baldwin, Jr. | ...... | H05K 7/20563 361/690 |

(Continued)

*Primary Examiner* — Robert J Hoffberg
(74) *Attorney, Agent, or Firm* — Meyertons Hood Kivlin Kowert and Goetzel PC; Jeffrey C. Hood

(57) ABSTRACT

Various types of electronic devices may be mounted in a chassis in order to facilitate interfacing with the devices, containing the devices, provide cooling systems which may remove heat from the electronic devices, etc. Delivering adequate cooling air flow to each electronic device in a chassis may be an important issue for the proper functioning, lifetime, or other characteristics of electronic devices contained in a chassis. Embodiments presented herein describe a novel design for an air flow straightener that is configured for insertion within the chassis to straighten the airflow. In some embodiments, the grating is comprised of long dividers and shorter dividers that are predominantly oriented perpendicularly to each other, resulting in a rectangular grating. Including such a grating in a chassis may improve the uniformity and performance of the cooling system.

9 Claims, 13 Drawing Sheets

(56) References Cited

U.S. PATENT DOCUMENTS

| | | | | |
|---|---|---|---|---|
| 7,667,966 B2* | 2/2010 | Ong | ............... | H05K 7/20181 |
| | | | | 165/80.2 |
| 8,085,540 B2* | 12/2011 | Vogel | ............... | F28D 1/024 |
| | | | | 165/104.33 |
| 8,520,404 B2* | 8/2013 | Hamaguchi | ............... | F16B 1/0057 |
| | | | | 361/801 |
| 9,058,159 B2* | 6/2015 | Lee | ............... | G06F 1/20 |
| 9,212,668 B2* | 12/2015 | Deng | ............... | F04D 25/166 |
| 9,690,338 B2* | 6/2017 | Peng | ............... | G06F 1/20 |
| 9,907,211 B2* | 2/2018 | Campbell | ............... | H05K 7/20181 |
| 9,968,006 B2* | 5/2018 | Campbell | ............... | H05K 7/20181 |
| 2012/0003912 A1* | 1/2012 | Hoover | ............... | H05K 7/20727 |
| | | | | 454/184 |
| 2012/0212906 A1* | 8/2012 | Chang | ............... | G06F 1/20 |
| | | | | 361/695 |
| 2015/0017904 A1* | 1/2015 | Liang | ............... | H05K 7/20736 |
| | | | | 454/184 |
| 2017/0325363 A1* | 11/2017 | Tsai | ............... | G06F 1/20 |

* cited by examiner

AIRFLOW STRAIGHTENER IN AN ELECTRONICS CHASSIS

BACKGROUND

Technical Field

The present invention relates generally to mechanisms for cooling electronic circuit boards, and more particularly, to the cooling of components by air flow generated by fans.

Description of the Related Art

Various types of electronic devices may be mounted in a chassis in order to facilitate interfacing with the devices, containing the devices, managing the devices, or other reasons. Some electronic devices generate excess heat in the course of their operation. In some embodiments, a chassis includes cooling systems which may remove heat from the electronic devices. An example of a cooling system is a fan or set of fans which may be configured to move air through or across the electronic devices. Delivering adequate cooling air flow to each electronic device in a chassis may be an important issue for the proper functioning, lifetime, or other characteristics of electronic devices contained in a chassis. As such, improvements in the field of controlling cooling air flow are desirable.

SUMMARY

Instruments for collecting data or information from an environment or unit under test may be coupled to and controlled by computer systems. Data collected by these instruments may be used to control units being tested (e.g., an overheated unit may be shutdown) or an environment (e.g., ventilation systems may be activated if a certain chemical is detected in the air). Instrumentation systems such as those described above may run on a platform such as Peripheral Component Interconnect (PCI) eXtensions for Instrumentation (PXI). PXI may combine a high-speed PCI bus with integrated timing and triggering features designed for measurement and automation applications to deliver performance improvements over other architectures. PCI or PXI devices may be comprised of modules which may be grouped together as modules in a chassis in some embodiments. However, due to the compact design of these modules, parts of the module may be difficult to cool sufficiently.

An example of a chassis includes a housing that is configured to define a plurality of slots and a system for providing cooling, an example of which is a set of fans providing air flow through the chassis. Modules may be inserted into the plurality of slots in the chassis. The plugin modules, which may be referred to herein as 'modules' or 'electronic devices', may be comprised either of PXI or PXIe cards, in various embodiments. In some embodiments, a chassis (such as a PXI chassis) may have slot-to-slot cooling disparities partially due to the fact that air exiting a typical electronics cooling fan has a swirl element associated with it. In these embodiments, the swirling air mixes prior to entering the card cage area in a non-uniform manner due to 3-dimensional mixing of the air. This non-uniform air flow pattern may provide some slots with more cooling than others and non-uniform cooling within each slot.

Embodiments presented herein describe a novel design for an air flow straightener, or 'grating', that is configured for insertion within the chassis to straighten the airflow. In some embodiments, the grating is comprised of long dividers which will be predominantly oriented along the x-direction of the chassis and will be arranged along a y' direction that is perpendicular to the x-direction. Furthermore, the grating may be comprised of shorter dividers that are predominantly oriented along the y'-direction and arranged along the x-direction. In some embodiments, the x and y' directions may be perpendicular to each other, resulting in a rectangular grating. Each of the first and second dividers may be oriented such that, upon inclusion in the channel of the chassis, they direct and straighten the flow of air along the channel.

Figure 1A:
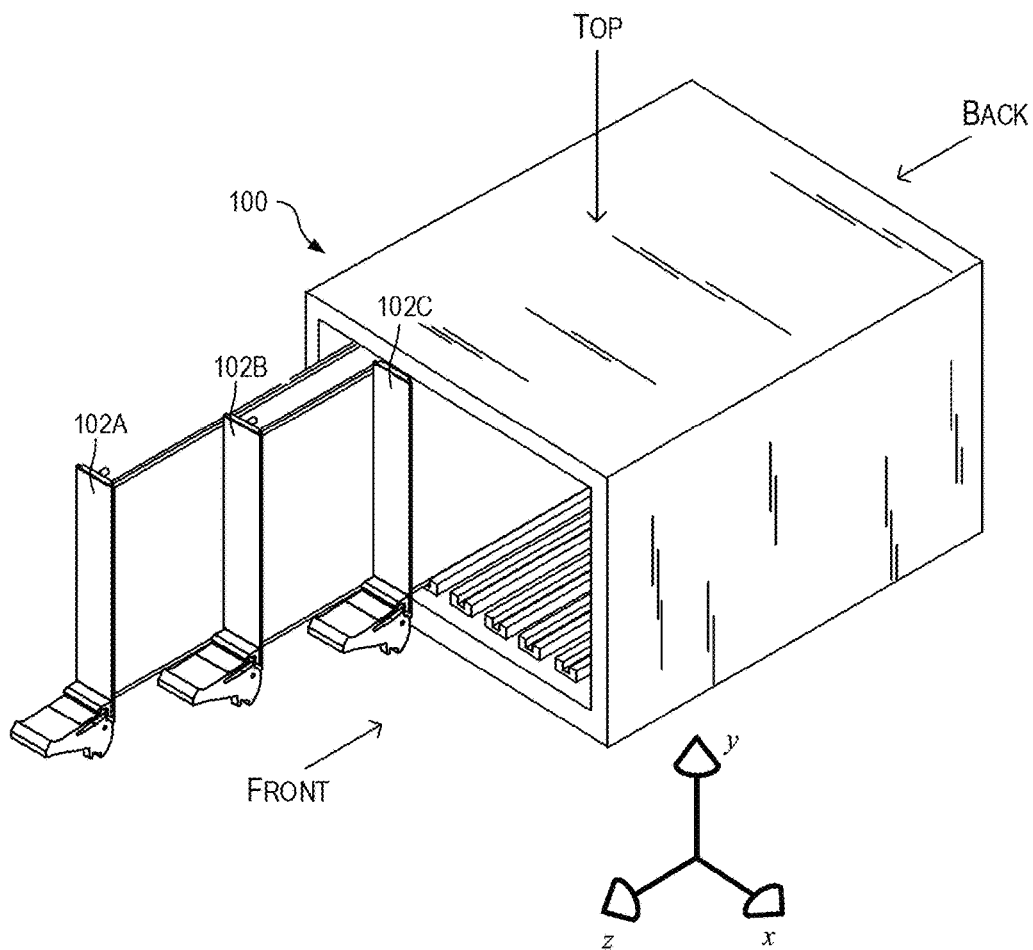
FIG. 1A illustrates a prior art chassis 100 and plug-in modules 102A-C.

While the invention is susceptible to various modifications and alternative forms, specific embodiments thereof are shown by way of example in the drawings and are herein described in detail. It should be understood, however, that the drawings and detailed description thereto are not intended to limit the disclosure to the particular form disclosed, but on the contrary, the intention is to cover all modifications, equivalents and alternatives falling within the spirit and scope of the present disclosure, including the appended claims. Particular features, structures, or characteristics may be combined in any suitable manner consistent with this disclosure.

It is to be understood that the terminology used herein is for the purpose of describing particular embodiments only, and is not intended to be limiting. As used herein, the singular forms "a", "an", and "the" include singular and plural referents unless the content clearly dictates otherwise. Furthermore, the words "can" and "may" are used throughout this application in a permissive sense (i.e., having the potential to, being able to), not in a mandatory sense (i.e., must). The term "include," and derivations thereof, mean "including, but not limited to." The term "coupled" means directly or indirectly connected.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "mobile device configured to generate a hash value" is intended to cover, for example, a mobile device that performs this function during operation, even if the device in question is not currently being used (e.g., when its battery is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed mobile computing device, for example, would not be considered to be "configured to" perform some specific function, although it may be "configurable to" perform that function. After appropriate programming, the mobile computing device may then be configured to perform that function.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

DETAILED DESCRIPTION

Instruments for collecting data or information from an environment or unit under test may be coupled to and controlled by computer systems. Data collected by these instruments may be used to control units being tested (e.g., an overheated unit may be shutdown) or an environment (e.g., ventilation systems may be activated if a certain chemical is detected in the air). Data may also be displayed to a user for control and/or experimental purposes (e.g., to improve the design of the unit being tested). Instruments and/or computer systems may also perform various data analysis and data processing on acquired data prior to control of the unit and/or display of the data to the user. Examples of various types of instruments include oscilloscopes, digital multimeters, pressure sensors, etc., and the types of information that might be collected by respective instruments include voltage, resistance, distance, velocity, pressure, oscillation frequency, humidity or temperature, among others.

Instrumentation systems such as those described above may run on a platform such as Peripheral Component Interconnect (PCI) eXtensions for Instrumentation (PXI). PXI may combine a high-speed PCI bus with integrated timing and triggering features designed for measurement and automation applications to deliver performance improvements over other architectures. PXI may be built on a modular and scalable CompactPCI specification and the high-speed PCI bus architecture. As a result, PXI products may maintain interoperability with CompactPCI, offering increased mechanical integrity, easier systems integration, and more expansion slots than desktop computers. However, due to the compact design of these modules, parts of the module may be difficult to cool sufficiently.

FIG. 1A illustrates an exemplary chassis 100, e.g., a chassis conforming to any one of the following standards: VXI (Virtual Machine Environment (VME) eXtensions for Instrumentation), VME, CompactPCI, CompactPCI-Express, PXI, or PXI-Express (PXIe). The chassis 100 includes a housing that is configured to define a plurality of slots. Each of exemplary plugin modules 102A-C may be inserted into the plurality of slots of chassis 100. The plugin modules, which may be referred to herein as 'modules' or 'electronic devices', may be PXI, PXIe, CompactPCI, or CompactPCI-Express cards, in various embodiments.

Figure 1B:
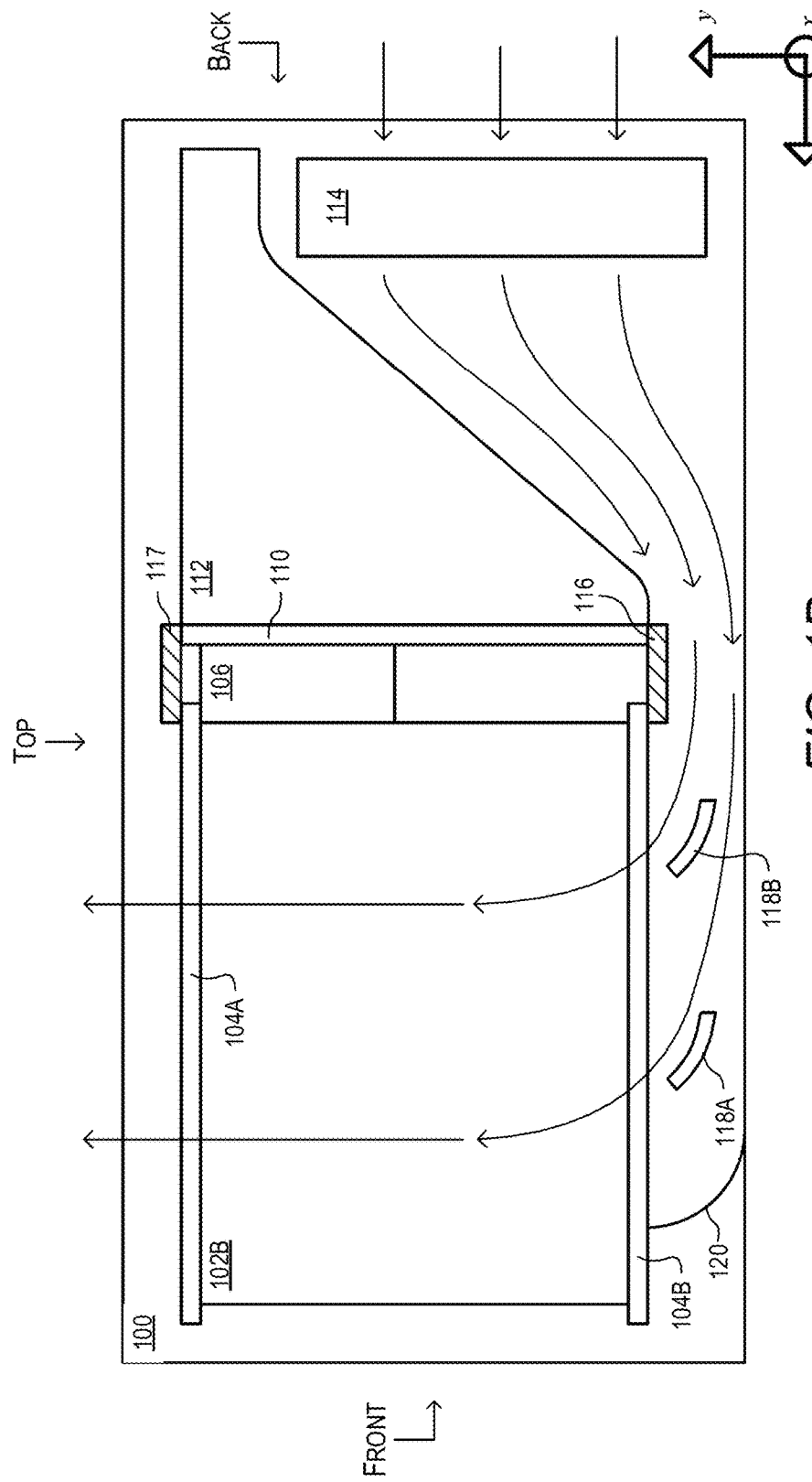
FIG. 1B illustrates internal air flow in a cross-sectional view of a prior art chassis 100.

FIG. 1B illustrates an internal structure of the exemplary chassis 100 showing plug-in module 102B inserted into the chassis 100. The plug-in module 102B may be guided during insertion into the chassis 100 by at least guide rails 104A-B until connectors 106 make connection. Connectors 106 may comprise a pair of connectors (not shown in FIG. 1B), one mounted on the plug-in module 102B and a mating connector mounted on the backplane 110. Additional circuitry 112 may be mounted behind the backplane 110 and may interact with the plug-in module 102B through the connectors 106. Backplane 110 and guide rails 104A-B may be coupled or attached to sub-rack support member 116. Pusher fan 114 may force air into the chassis 100 and under the support member 116 (arrows indicate typical air flow). Air flowing under the support member 116 may be redirected by vanes 118A and 118B and deflector 120 toward heat producing components of plug-in module 102B.

Figure 2:
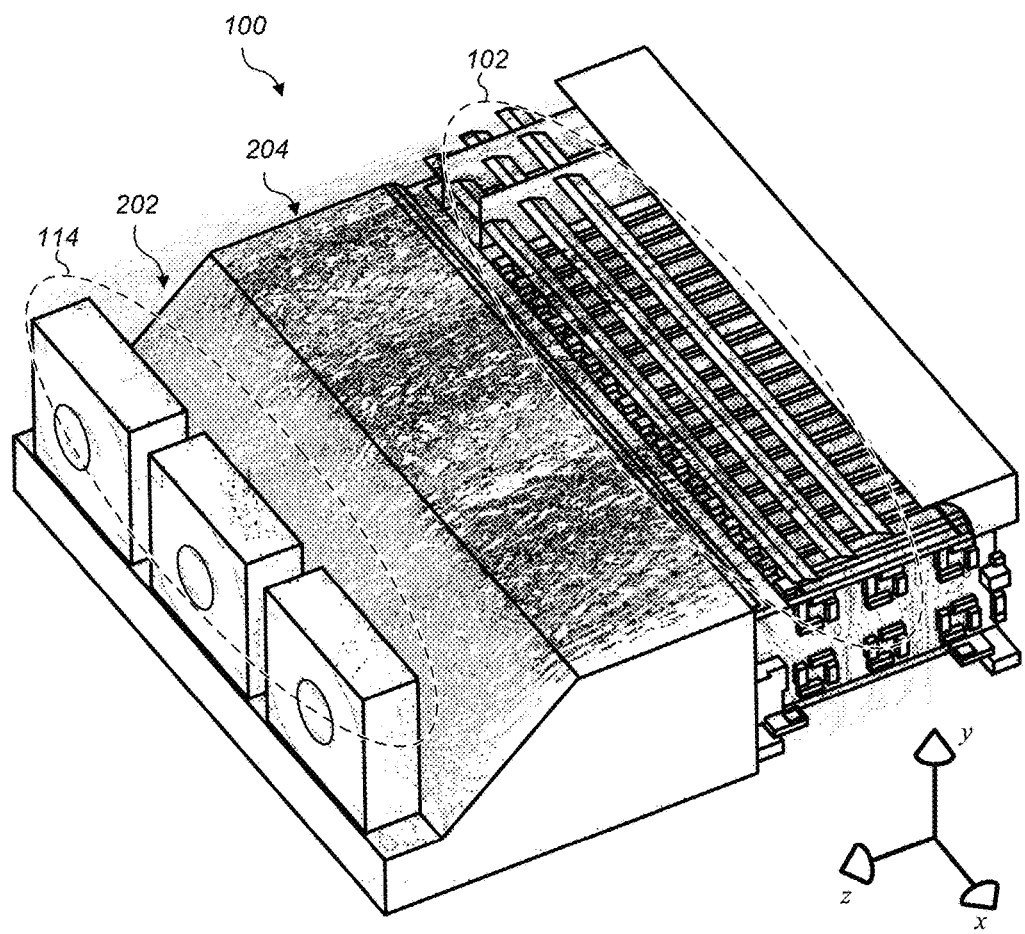
FIG. 2 illustrates the components and air flow of a chassis 300, according to some embodiments.

FIG. 2 illustrates an isometric bottom up view of an embodiment of a chassis 100, which includes a set of fans 114 and a set of modules 102 which require cooling. In the illustrated embodiment, simulated air flow is shown using gray dashed lines, which represent the path of a single simulated air particle. Air flow may be created by fans 114, pass through the chassis and over the modules 102, and then exit the chassis 100, carrying away excess heat. In the illustrated embodiment, a coordinate system may be defined such that multiple modules may be included in the chassis such that modules are placed adjacent to each other in the x direction, and the air flow from the fans passes through the chassis substantially along the z direction, and then exits the chassis predominantly along the y-direction.

FIG. 2 shows a chassis that has three axial fans 114 arranged along a horizontal direction, hereinafter referred to as the x-direction. In other words, the direction that leads from the center of one fan to the center of an adjacent fan is herein referred to as the x-direction. In the present disclosure, the phrase 'arranged along' may refer to the direction leading from an object to a subsequent object.

FIG. 2 further illustrates that the three axial fans are predominantly oriented in a first plane, wherein the first plane consists of the x-direction and a second, vertical direction (e.g. when the chassis is oriented horizontally) that is perpendicular to the first direction. This second direction will be referenced in the present disclosure as the y-direction. Herein 'predominantly oriented in' and 'predominantly oriented along' refer to the orientation of an object in space according to its largest dimension or dimensions. We further note that in the case of a single object, the phrases 'arranged along' and 'predominantly oriented along' will be taken synonymously, such that both phrases refer to the orientation of an object in space according to its largest dimension or dimensions.

FIG. 2 further illustrates that the three axial fans are configured to blow air predominantly in a third direction that is perpendicular to the first plane (i.e., the third direction is perpendicular to each of the x and y directions). This third direction will be herein referred to as the z-direction. Hence, the x, y, and z directions form a mutually perpendicular set of cartesian coordinate axes. As illustrated, the blown air is directed through a ramped or 'sloped' channel 202. The ramped channel 202 may be referred to as a 'first region' 202 of the channel. Hence, in the illustrated embodiment, after leaving the fans the blown air acquires a velocity component in the y-direction (e.g., so that the air velocity is predominantly in the y-z plane) until it reaches the flat 'plateau' section of the channel 204, wherein the predominant direction of airflow is again along the z-direction. The plateaued section of the channel may herein be referred to as the 'second region' 204 of the channel. FIG. 2 illustrates a set of electronic devices 102 (e.g., modules) to be cooled at the end of the channel, wherein the electronic devices are arranged along the x-direction.

We note briefly that the x, y, and z directions are intended to be bidirectional. For example, the x direction above refers to the dimension along which the fans are arranged, and is not specifically either the 'left' or the 'right' direction (e.g., when viewed from behind the fans). Similarly, the y-direction refers to the vertical dimension (e.g., when viewed with the chassis predominantly oriented horizontally), perpendicular to the first direction, along which the fans are predominantly oriented, and the y-direction encompasses both the 'up' direction and the 'down' direction in this example.

Figure 3:
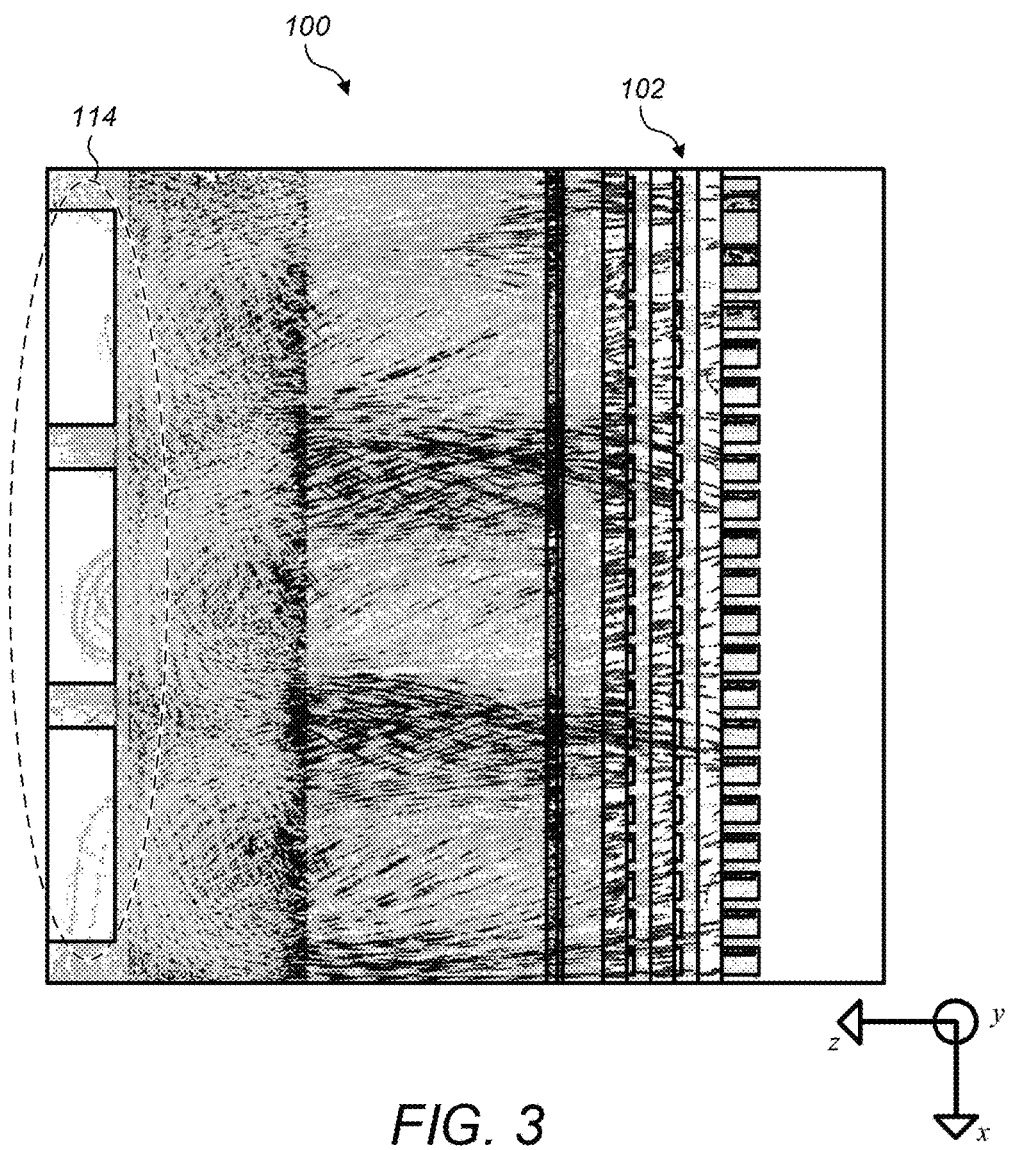
FIG. 3 is a diagram illustrating the components and air flow of a chassis 400 from a bottom up view, according to some embodiments.

FIG. 3 illustrates a similar chassis as FIG. 2, presented from a different view (bottom up view). In the illustrated embodiment, the chassis is shown from the y direction (i.e., the y direction comes directly out of the plane of the image), oriented such that the fans 114 are located on the left. Air flow is again depicted by grey dashed lines. In the illustrated embodiment, it may be seen that many of the air flow lines do not travel in a straight line from the fans 114 to the modules 102. The average direction of air flow may be along the z-direction, as defined by the coordinate system of FIG. 4, while individual air flows may include directions along the x and y-directions as well. The non-uniform nature of the air flow may cause the cooling to be unequally distributed.

Figure 4:
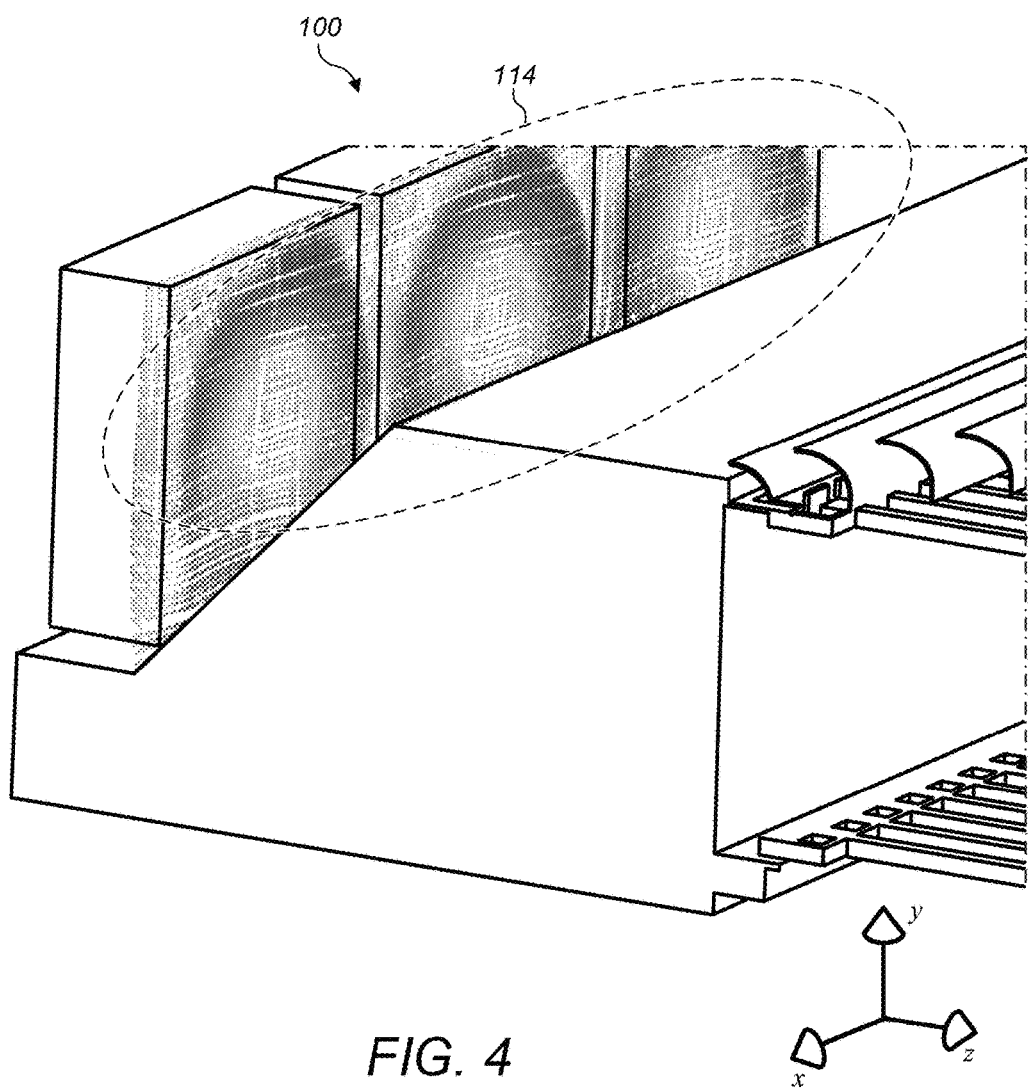
FIG. 4 is a diagram illustrating a swirl element from fans in a chassis, according to some embodiments.

FIG. 4—Non-Uniform Air Flow

In some embodiments, a chassis (such as a PXI chassis) may have slot-to-slot cooling disparities partially due to the fact that air exiting a typical electronics cooling fan has a swirl element associated with it. In these embodiments, the swirling air mixes prior to entering the card cage area in a non-uniform manner due to 3-dimensional mixing of the air. This non-uniform air flow pattern may provide some slots with more cooling than others.

FIG. 4 is a simulation of air flow near fans in an electronic chassis. As illustrated, the air flow that results from the three fans 114 is highly non-uniform, as eddy currents from the fans lead to areas of both high and low air velocity. In some embodiments the fans may be axial fans, though other types of fans are also possible. This nonuniform airflow may cause some of the plugin modules to receive insufficient cooling (e.g., those located in a relatively lower airflow region), potentially leading to overheating. Other plugin modules may receive more airflow than is necessary for sufficient cooling (e.g., those located in a relatively faster airflow region), leading to power inefficiencies and/or higher levels of noise since the fans may be operating at a higher level of power consumption than would be necessary if the air flow was more spatially uniform.

FIG. 4 illustrates the velocity of air exiting cooling fans 114 using grey lines of varying darkness. The shade of grey indicates the speed of the air leaving the fan, with speeds ranging from, e.g., 0 (lightest grey) to approximately 50 ft/sec for a typical fan chassis (darkest grey), in some embodiments. Other types of fans with different distributions of airflow speed are also possible. In addition to the swirl described previously, and illustrated in the arrangement of the grey lines, the axial fans illustrated in this embodiment exhibit a zone of decreased air flow in the center of the fan. In some embodiments, an axial cooling fan may include a hub which does not generate air flow. This hub may lead to a zone of slower air flow in the center of the fan, as illustrated in FIG. 4.

Figure 5:
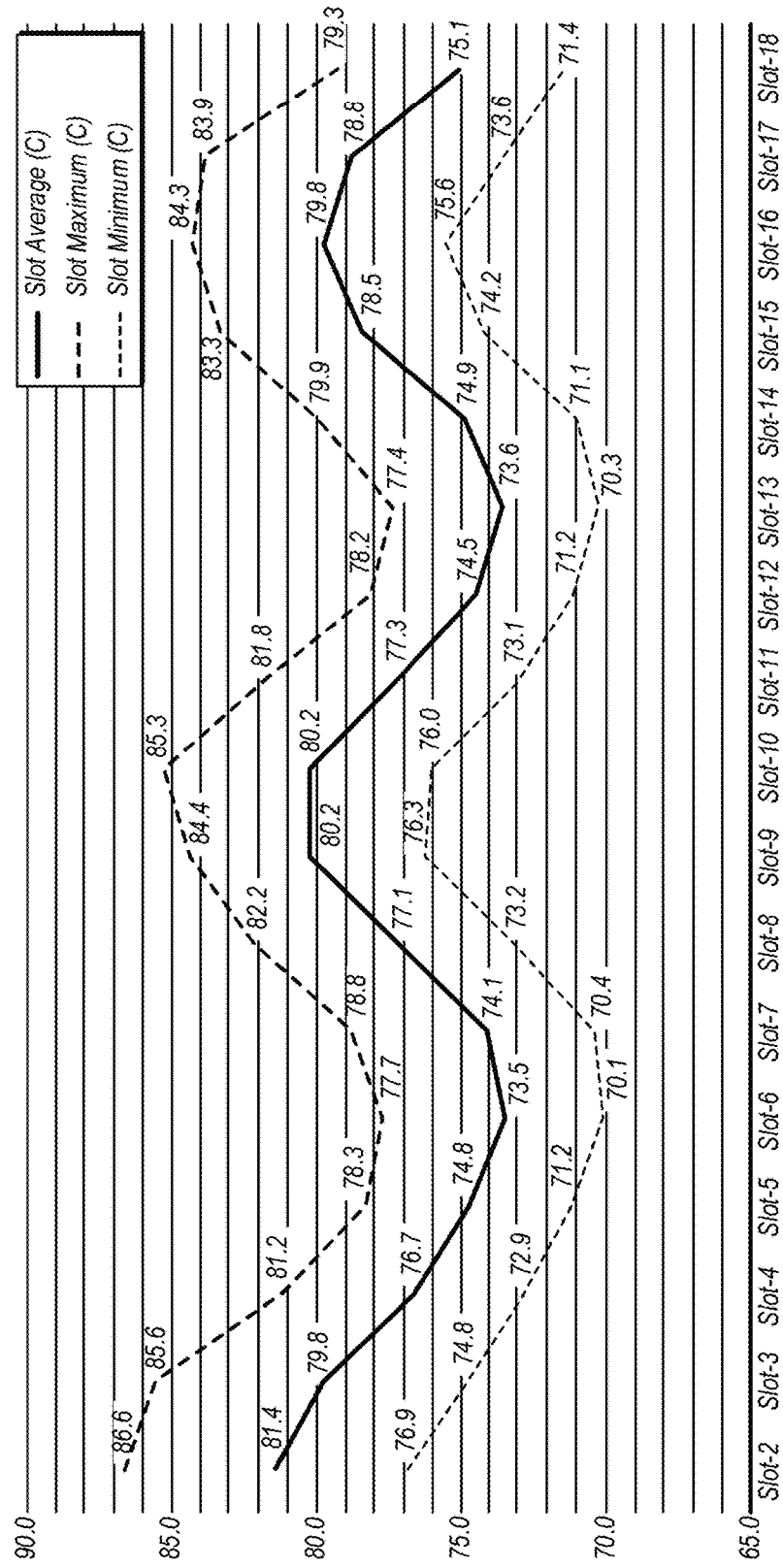
FIG. 5 is a diagram illustrating the variation of temperatures of modules in various slots in a chassis, according to some embodiments.

FIG. 5—Temperature Variation without an Airflow Straightener

FIG. 5 illustrates the temperatures of modules included in the slots of the chassis while they are being cooled without an airflow straightener. In the illustrated embodiment, the number of the slot is arranged along the horizontal axis, and the temperature in degrees Celsius is displayed along the vertical axis. The light dashed line indicates the minimum temperature of each module over a measuring period, the thick dashed line indicates the maximum temperature of each module over the measuring period, and the solid line indicates the average temperature of each module over the measuring period. In the illustrated embodiment, there may be a different average temperature between slots, and the difference is illustrated to be as great as 7.9 degrees Celsius for the data shown. In some embodiments, there may be a peak temperature for each fan. In some embodiments, the peak temperatures may be caused by a combination of the swirl effect displacing air flow, the hub effect decreasing airflow, or other effects of the fans and chassis which cause the air flow to be non-uniform.

Embodiments presented herein describe a novel design for an air flow straightener, or 'grating', that is configured for insertion within the chassis 400 to straighten the airflow, thereby reducing non-uniformity of the air flow.

Figure 6:
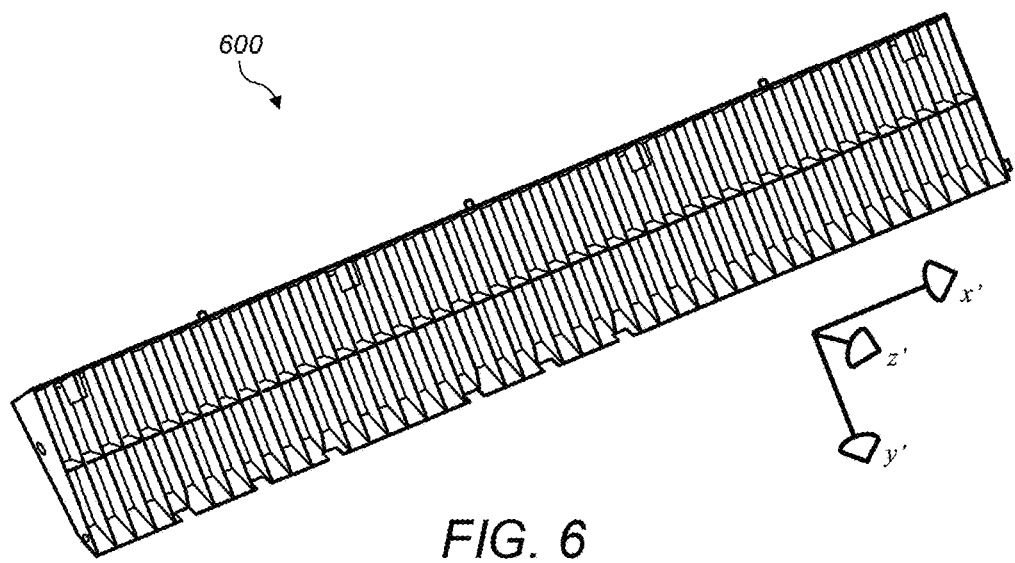
FIG. 6 is a diagram illustrating a device for straightening air flow, according to some embodiments.
Figure 7:
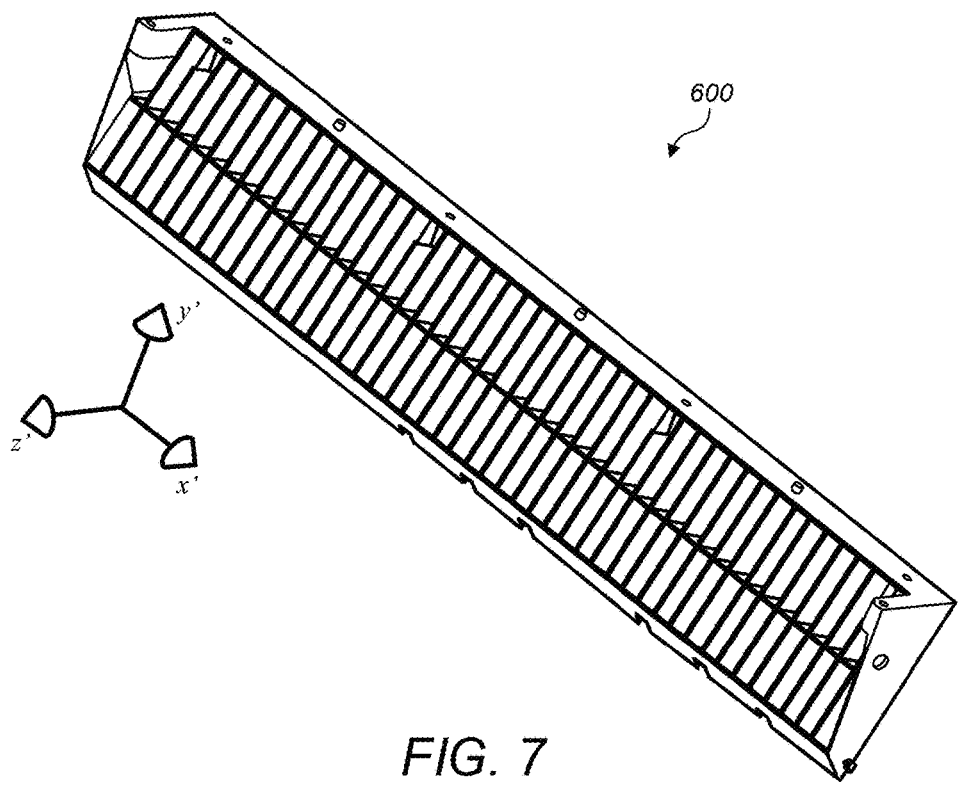
FIG. 7 is a diagram illustrating another view of a device for straightening air flow, according to some embodiments.

FIGS. 6 and 7—Airflow Straightener

FIGS. 6 and 7 are schematic diagrams of an airflow straightener 600, according to exemplary embodiments. In various embodiments, an airflow straightener is any part or device placed in the airflow which is designed to reduce swirling of air and increase uniformity of cooling of a typical electronics cooling fan. In some embodiments, the air flow straightener is a plastic injection molded part with many vertical vanes (or 'dividers') and three horizontal vanes ('dividers') mounted upstream of the electronics the airflow is intended to cool. More generally, in some embodiments, the air flow straightener may comprise a grating, wherein the grating is comprised of a plurality of dividers positioned in such a way as to direct the air flow along the channel.

As described in further detail below, the vanes may be of a depth to sufficiently "correct" the airflow, reducing swirl and increasing uniformity, but may have a small thickness to reduce airflow impendence. FIGS. 6 and 7 are front and rear isometric views of an exemplary airflow straightener 600, respectively.

Figure 8:
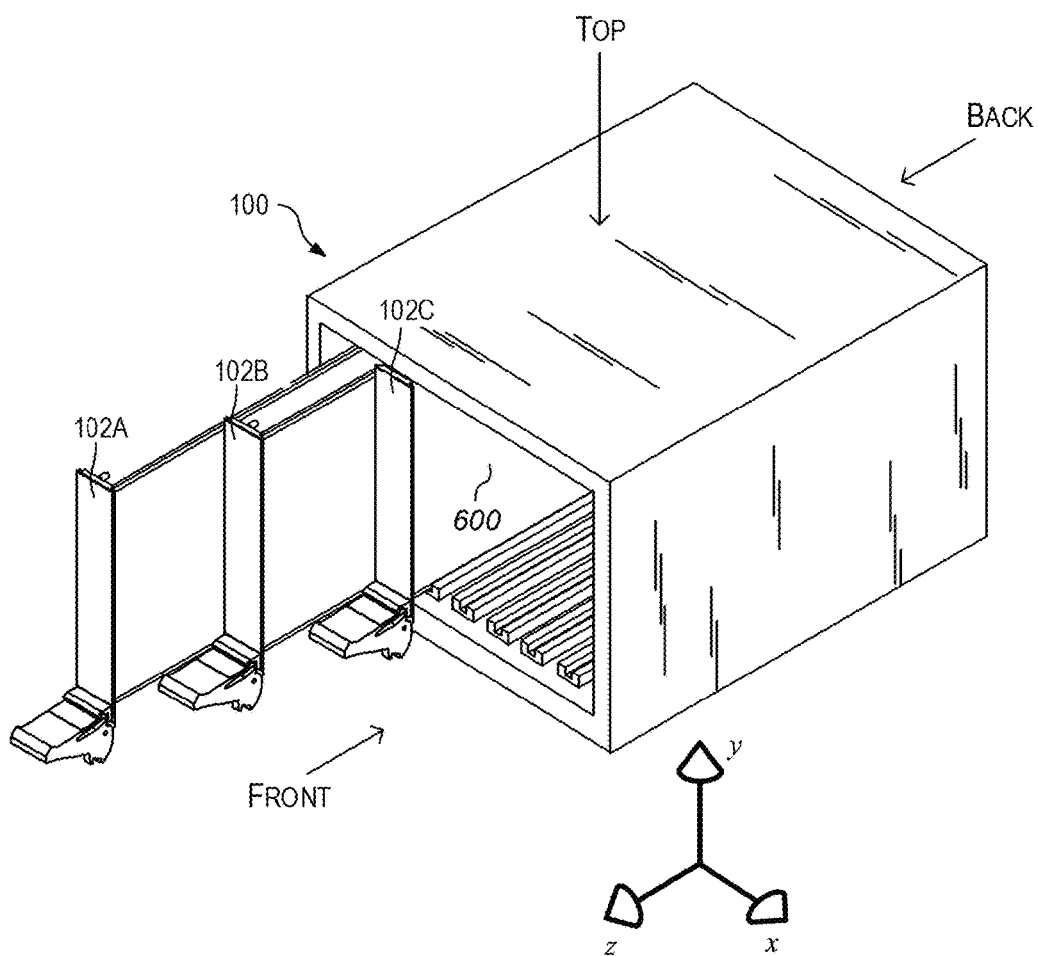
FIG. 8 is an outside view of a chassis that is configured to include an air flow straightener, according to some embodiments.
Figure 9:
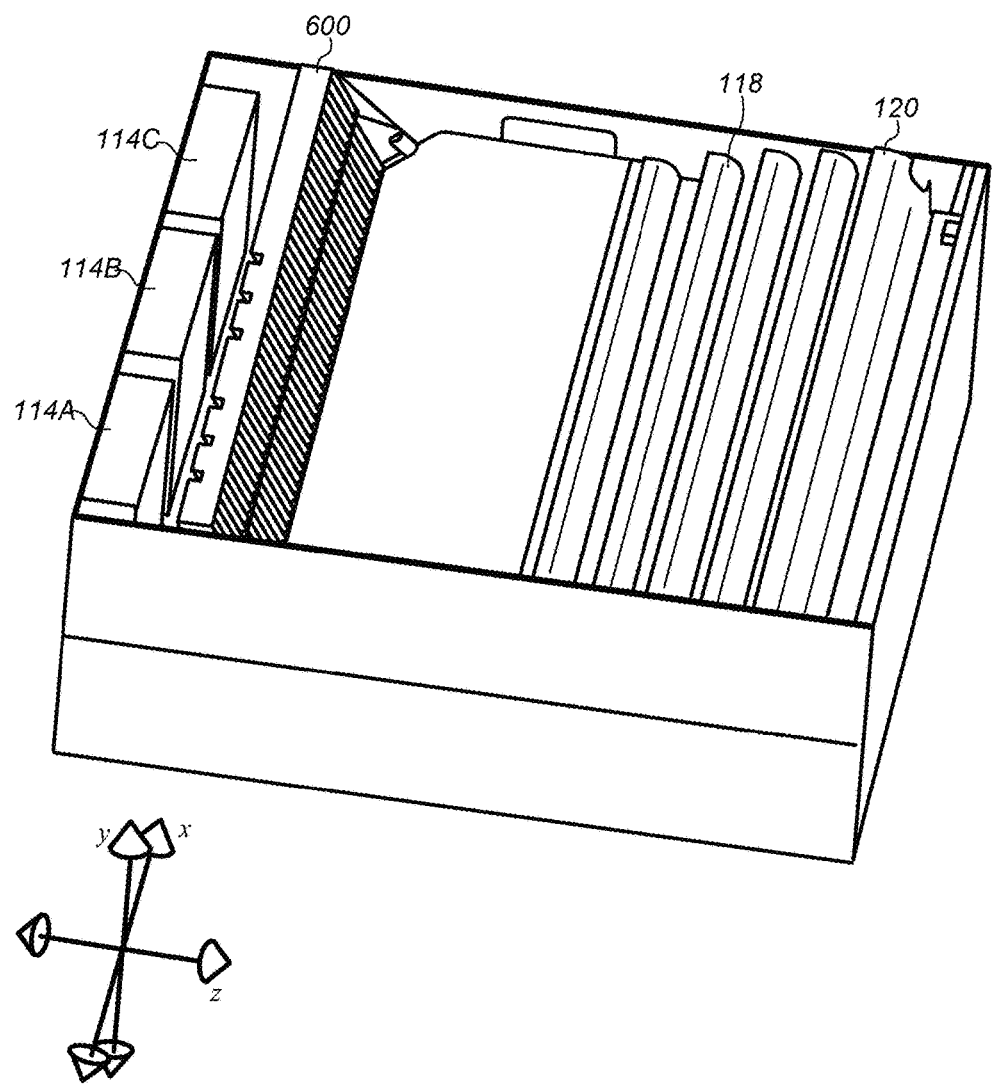
FIG. 9 is a diagram illustrating a chassis including an air flow straightener, according to some embodiments.

FIGS. 8-9—Chassis with Inserted Airflow Straightener

FIG. 8 illustrates an outside view of a chassis that is configured to contain an airflow straightener 600 (not shown), according to some embodiments. FIG. 9 illustrates an inside view of the chassis with air flow straightener 600 in position, according to some embodiments. FIG. 9 illustrates the chassis from a predominantly bottom up view, so that the components may be more easily identified. Straightener 600 is positioned a distance away from fans 114, and in the sloped region of the chassis (first region 202), as discussed above. In some embodiments, the functionality of the airflow straightener may be decreased by positioning it directly next to, or within a small region in front of, the fans. Some examples of decreased performance include a larger amount of noise generated by the fan, a higher airflow impedance, or less effective air straightening. The distance of the airflow straightener from the fans may be determined based on a balancing of the airflow straightening, impedance, noise, or other factors. Also illustrated in FIG. 9 are air-directing vanes 118 and deflector 120, which are located near the heat-producing modules 102 (not shown).

As illustrated in FIG. 9, the invention may be mounted directly downstream of the fans but upstream of the electronics. As illustrated, it is mounted from the top but could be mounted from many different places.

Airflow Straightener Design

In some embodiments, the air flow straightener may be designed based on the shape and design of the chassis and the enclosed modules. For example, in exemplary embodiments, the air flow straightener may be designed based on the geometry illustrated in FIG. 2 and described above.

In reference to the dividers of the grating, 'predominantly oriented' is taken to refer to the orientation of the longest dimension of the divider. Conversely, the direction along which the dividers are 'arranged' is taken to refer to the direction leading from a particular divider to the closest part of an adjacent divider. The direction along which the dividers are arranged is additionally taken to refer to the direction that defines the 'thickness' of the divider. It may be further appreciated that the dividers have a 'depth' which we define as the extent of the divider in the direction perpendicular to each of the predominant orientation direction and the arrangement direction. The direction defining the depth of the dividers will be herein referenced as the z'-direction.

In the illustrated embodiment in FIGS. 6 and 7, the grating is comprised of three long dividers (herein referred to as 'first dividers') which, when placed within the chassis, will be predominantly oriented along an x'-direction and will be arranged along a perpendicular y'-direction. Once inserted into the chassis, in exemplary embodiments the x'-direction will coincide with the x-direction. Furthermore, the grating of FIGS. 6 and 7 is comprised of forty-seven shorter dividers (herein referred to as 'second dividers') that are predominantly oriented along the y'-direction and arranged along the x'-direction. In some embodiments, the x' and y' directions may be perpendicular to each other, resulting in a rectangular grating. Other numbers of first and second dividers are also possible. Each of the first and second dividers may be oriented such that, upon inclusion in the channel of the chassis, they direct the flow of air along the channel.

In some embodiments, other orientations and alignments of the dividers may be used. As one possibility, the second dividers may be oriented along a different direction, y", and arranged along a different direction, x", (wherein y" is perpendicular to x"). This may result, for example, in a non-rectangular grating that is comprised of parallelogram-shaped holes. As another possibility, the grating may be comprised of a plurality of third dividers, wherein the first, second and third dividers are oriented and arranged to produce a honeycomb configuration. In various embodiments, the honeycomb configuration may result in a series of holes that are shaped like perfect hexagons, or the holes may be shaped like oblong hexagons. In some embodiments, the shortest dimension of the oblong hexagon-shaped holes may be oriented along the x-direction once the straightener is inserted into the chassis.

The following paragraphs describe various design features of the airflow straightener that may be implemented, according to various embodiments. The specific characteristics of each of these design features may be determined from simulated or experimental results, to achieve an increased amount of airflow straightening with a reduced amount of airflow impedance.

In various embodiments, the dividers may have rounded leading edges, rounded trailing edges, or leading and trailing edges may both be rounded. In some embodiments, rounding the edges of the dividers may reduce the level of noise produced by the airflow straightener. In some embodiments, rounding the edges may reduce the airflow impedance caused by the airflow straightener.

In some embodiments, the dividers may have varying thicknesses in either or both of the z' direction and the y' direction. For example, increasing the thickness of the dividers in the z' direction (e.g., so that the edge of the divider farthest from the fans is thicker than the edge closest to the fans) may reduce a resultant impedance to the airflow. in some embodiments, depending on the specific characteristics of the airflow swirl, changing the thickness along the y' direction may reduce impedance to the airflow.

In some embodiments, the first dividers may have a variable spacing along the y' direction. In some embodiments, the second dividers may have a variable spacing along the x' direction. The variable spacing of either or both of the first and second dividers may be determined from simulated or experimental results, to achieve an increased amount of airflow straightening with a reduced amount of airflow impedance.

In some embodiments, the first and/or second dividers may be curved. For. For example, the first and/or second dividers may be curved in the x'-y' plane, or they may have a curved "cross-section", i.e., they may be curved in the x'-z' plane.

In some embodiments, portions of the airflow straightener may be "plugged" so that no air can pass through. In various embodiments, the plugged portions may be permanent or removeable as needed. Some embodiments may support reconfigurable assembly, such that dividers or "plugs" may be removed or inserted as needed for a particular chassis implementation. In some embodiments, the first and/or second dividers may be rotatable. For example, the dividers may be reconfigurable by the user or prior to chassis assembly. In some embodiments, the dividers and/or plugs may be reconfigurable to a permanent or semi-permanent setting, and the airflow resultant from the airflow straightener may be configured to be selectively directed in particular areas. For example, the plugs and/or dividers may be configured to direct relatively more airflow to power dense modules of areas of the chassis, or modules or areas that otherwise generate a greater amount of heat.

FIGS. 6 and 7 further illustrate that the dividers are included within a support member, which facilitates insertion of the air flow straightener into the chassis. For example, the support member may be designed to fit snugly into the channel of the chassis such that air is not able to flow between the outer boundary of the air flow straightener and the inner wall of the channel. As illustrated, the support member may further comprise holes that allows the air flow straightener to be secured to the chassis (e.g., using screws or bolts). In some embodiments, the air flow straightener may be configured to be removable from the chassis.

In the illustrated embodiment of FIGS. 6 and 7, the outermost dividers of each of the first dividers and the second dividers are positioned flush against the respective wall of the support member. In other embodiments, the walls of the support member may themselves be considered as the 'outermost dividers'. For ease of discussion, the number of dividers along a particular direction will always be counted in the present disclosure such that the outer walls of the airflow straightener are considered the outermost dividers, regardless of whether the outer walls of the airflow straightener are flush against an outermost divider (and hence the outer wall and the outermost divider together comprise a single divider), or whether the outer walls are themselves functioning as a divider.

In some embodiments, the second 'plateau' region of the air flow channel may have a smaller average cross sectional area than the first 'ramped' region of the channel. Because of this, the airflow may have a higher average speed in the second region than in the first region (e.g., because of Bernoulli's principle). Impedance of the air flow by the dividers is caused at least in part by friction between the moving air and the dividers, or 'air drag'. Because air drag generally increases as a function of air speed, a divider may introduce a larger impedance to the air flow if it is placed in the second region rather than the first region. As a result, in some embodiments, the airflow straightener may be positioned inside the first region of the channel, where the average air speed is slower. This may improve the functionality of the airflow straightener, for example, because the dividers may straighten the airflow with relatively less impedance compared to if they were positioned in the second region.

In some embodiments, in the sloped first region, the flow of air is compressed and directed 'upward' along the direction of the slope, such that the air flow acquires a velocity component along the y-direction in addition to its z-direction velocity component (e.g., in the first region, the flow of air is in the y-z plane). Because of this, the average velocity of the air in the first region may be in a direction that is intermediate between the slope of the channel and the z-direction. To reduce air flow impedance resulting from the air straightener, it may be desirable in some embodiments to orient the airflow straightener such that the z'-direction is aligned parallel to the direction of the average velocity of air flow. In other words, the air flow straightener may be designed such that, when it is inserted into the sloped first region, the z'-direction points intermediate between the z-direction and the direction of the slope of the first region.

In some embodiments, the average air velocity in the first region as a function of y may gradually shift from pointing predominantly along the z-direction at the top of the channel (e.g., the air flow may be mostly horizontal at the top of the channel) to pointing predominantly along the slope of the channel at the bottom of the channel (e.g., the air flow near the sloped wall may be mostly along the slope). In these embodiments, it may be desirable to have a variable orientation of the first (horizontal) dividers, such that each first divider is oriented such that the z'-direction is oriented along the direction of average air velocity at the position of the divider. In other words, the z'-direction may be customized for each of the first dividers. For example, for the embodiment illustrated in FIG. 6 with three first dividers, the topmost divider may have z' oriented parallel to the z-direction, the bottommost divider may have z' oriented parallel to the direction of the slope of the ramped region, and the middle divider may have z' oriented halfway between the z-direction and the direction of the slope of the ramped region. It may be appreciated how this design principle may be generalized for other numbers of first dividers. For example, the first dividers may have their z' orientation change linearly from pointing in the z-direction at the top to pointing along the slope of the ramped region at the bottom.

In some embodiments, decreasing the spacing between adjacent dividers may provide increased straightening to the air flow, as the higher divider density further restricts the movement of air through the air flow straightener. Conversely, decreasing the spacing between adjacent dividers may also increase impedance to the air flow, since a higher divider density may result in more material and friction to obstruct the flow of air. In some embodiments, the spacing between adjacent dividers may be designed to balance an advantageous amount of air flow straightening with an acceptable amount of air flow impedance. As explained in detail below, the spacing may be separately designed for each of the first and second dividers based on the geometry and structure of the chassis, to further improve the performance of the airflow straightener.

Because the electronic devices comprised within the chassis are arranged along the x-direction, non-uniformity of the air flow may be a greater concern along the x-direction than along other directions. For example, in the non-straightened airflow simulation of FIG. 3, the nonuniformity of airflow along the x-direction may lead to some electronic devices receiving more cooling than others. Non-uniformity of the airflow along the y-direction, for example, may be of relatively less concern because the airflow will be redirected by the vents 118 to the modules, such that non-uniformity of the airflow along the y-direction may not adversely influence which modules the airflow is directed toward. Furthermore, in some embodiments and as illustrated in FIG. 2, the ramped first region compresses the air flow along the y-direction, which decreases the magnitude of non-uniformity of the air flow along the y-direction (e.g., because of the shape of the first region of the channel). In other words, using the airflow straightener to straighten the airflow along the y-direction may be relatively less important than straightening the airflow along the x-direction, since the ramped first region serves to compress the air along the y-direction, which thereby reduces the magnitude of airflow nonuniformity in the y-direction.

In some embodiments, because of the foregoing and other concerns, it may be desirable to design the spacing between adjacent second dividers to be smaller than the spacing between adjacent first dividers. For example, a smaller spacing between adjacent second dividers may increase the straightening of the air flow along the first direction (at the cost of extra airflow impedance). Similarly, a larger spacing between adjacent first dividers may reduce the impedance of the airflow (since straightening the air along the fourth direction may be less important). In combination, having a smaller spacing between adjacent second dividers than between adjacent first dividers may result in an advantageous combination of a larger degree of airflow straightening in the x-direction with limited airflow impedance. The functionality of the airflow straightener in these embodiments may be superior to what would result if the first and second dividers had equal spacing, or if the first dividers had a smaller spacing than the second dividers.

In some embodiments, the thickness of the dividers may be designed to be as thin as possible without violating the structural integrity of the dividers. For example, depending on the material of which the dividers are made, the dividers may be made as thin as possible such that the dividers are not damaged by the air flow, or by normal use and wear-and-tear.

In some embodiments, structural characteristics of the dividers may be determined to increase the degree of airflow straightening while reducing the resultant impedance to the airflow. For example, in some embodiments the depth of the dividers may be determined to achieve adequate airflow straightening without incurring undesirable impedance to the airflow. For example, increasing the depth of the dividers will in general increase both the degree of airflow straightening and the degree of airflow impedance (since a divider with a larger depth will present more air drag). Using models, laboratory testing, and/or simulations, a depth of the dividers may be determined to produce adequate straightening without an unacceptable level of impedance.

In some embodiments, the airflow straightener 600 may perform one or more auxiliary functions in addition to straightening the air flow. For example, in some embodiments the grating may have safety functionality. For example, it may function as a protective barrier to prevent a user from accidentally coming into physical contact with the cooling fans. In some embodiments, the grating may serve as a protective barrier to prevent a user from coming into physical contact with one or more electronically charged components (e.g., to prevent electric shock). In some embodiments, the grating may serve to prevent debris from being transported through the channel toward the one or more electronic devices.

In some embodiments, the airflow straightener 600 may serve as a mounting substrate for additional components of the chassis. For example, the airflow straightener may be configured to have diodes or Circuit Card Assemblies (CCAs) mounted on it. In some embodiments, the airflow straightener may serve a structural role, i.e., it may be constructed as a structural component or an internal frame of the chassis.

In some embodiments, the airflow straightener 600 may be manufactured from one material or combinations of various materials including: metals, sintered powdered metals, insulators, injection molded plastic, 3D printed materials and composites. In some embodiments, airflow straightener 600 may be manufactured by any of various processes including: extrusion with secondary machining, casting, stamping and forming of sheet metal, injection molding, molding/sintering of sintered powdered metals, 3D printing or combinations of these or other processes. The airflow straightener 600 may be one piece or an assembly of several pieces. In one embodiment, for instance, the horizontal dividers and/or vertical dividers may be molded from plastic (or formed from sheet metal or any of the above manufacture processes) and attached to a support member by any of several known assembly techniques.

Figure 10:
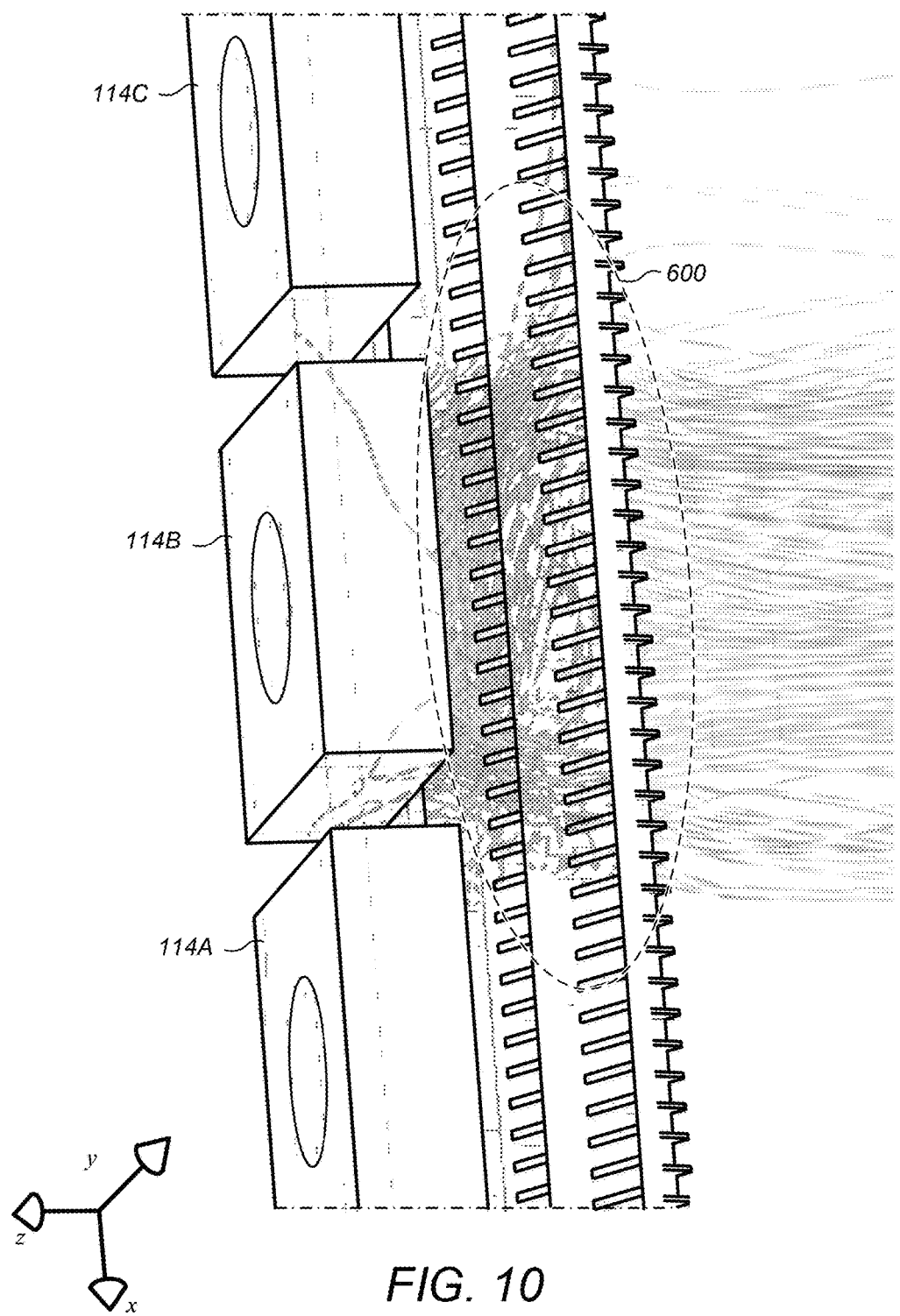
FIG. 10 is a diagram illustrating air flow through a chassis including an air flow straightener, according to some embodiments.

FIG. 10—Closeup of Airflow Straightening

FIG. 10 illustrates a closeup view of a small section of the chassis, showing primarily the cooling fans 114 and the air flow straightener 600. Air flow is illustrated as dashed grey lines, similar to previous figures. In the illustrated embodiment, air flow exits the fan containing velocity components in directions that are not perpendicular to the fan orientation. After passing through air flow straightener 600, the flow of air has been substantially changed to be largely in a single direction (the z-direction, perpendicular to the fan orientation), in the illustrated embodiment.

Figure 11:
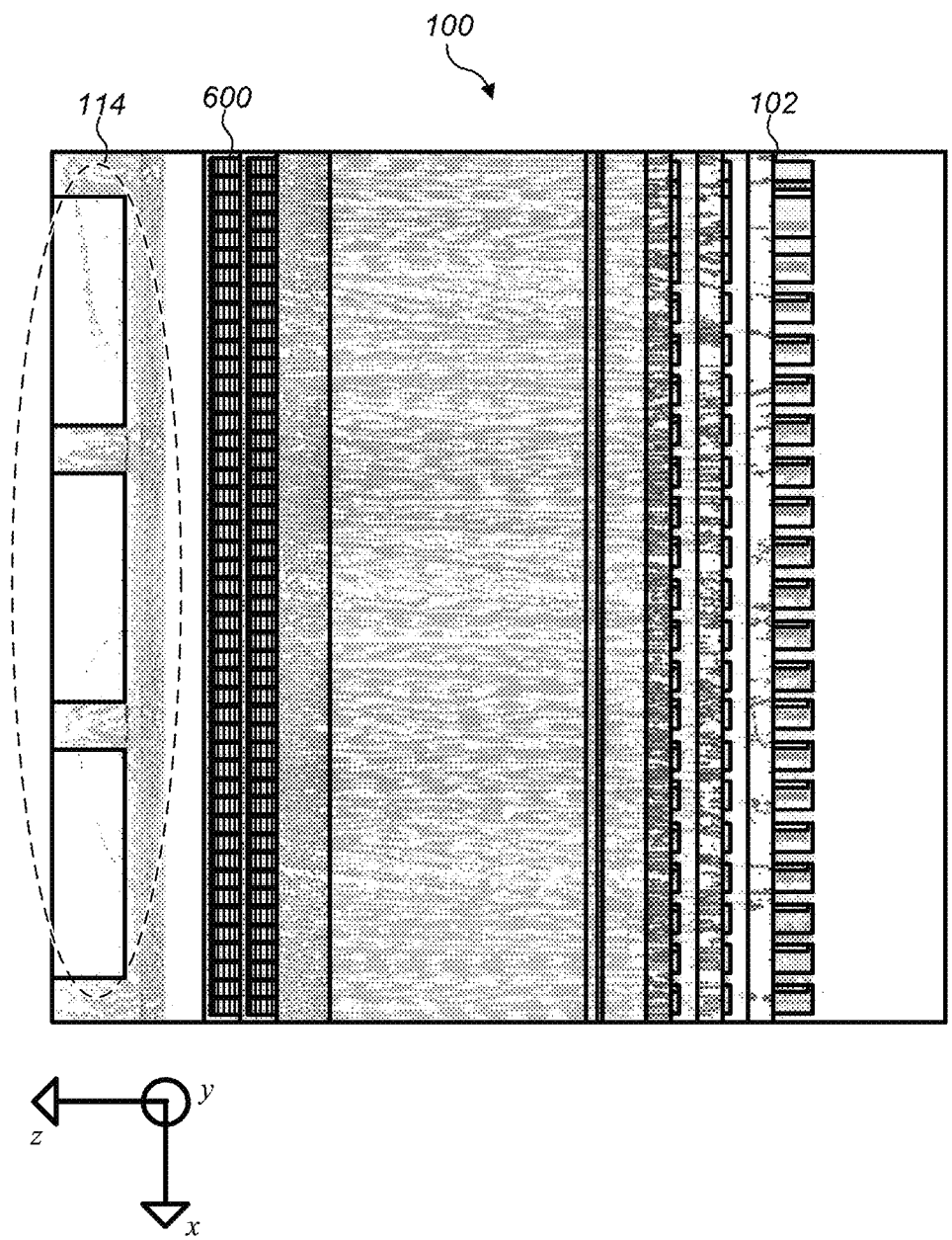
FIG. 11 is a diagram illustrating air flow through a chassis including an air flow straightener from a bottom up view, according to some embodiments.

FIG. 11—Bottom Up View of Chassis with Airflow Straightener

FIG. 11 also illustrates the air flow within the chassis 100 including an air flow straightener. The view of FIG. 11 is from the bottom up, similarly to FIG. 3. In comparison to the embodiment of FIG. 3 the air flow can be seen to be largely along the z-direction with less velocity along the x-direction.

Figure 12A:
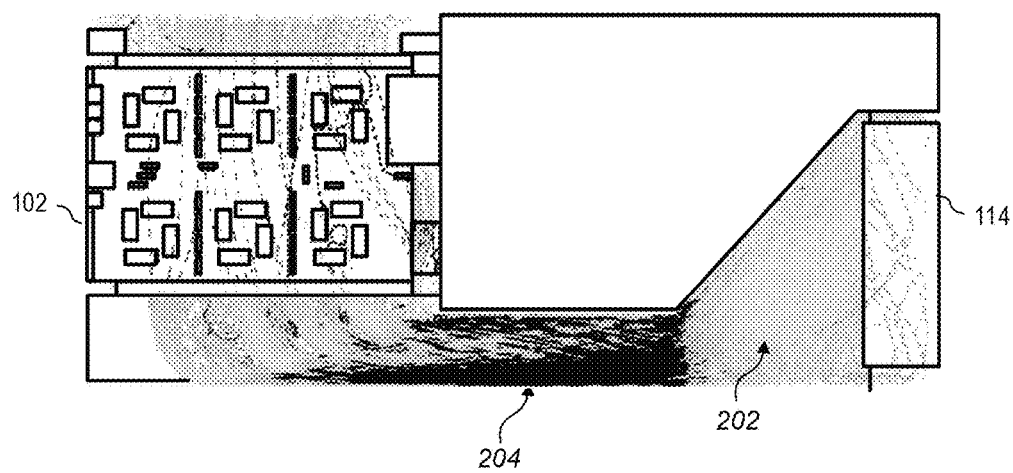
FIG. 12A is a diagram illustrating a cross section of air flow through a chassis without an air flow straightener from a side view, according to some embodiments.

FIG. 12A—Side View of Airflow in Chassis without Straightener

FIG. 12A illustrates a cross section view of the chassis, where there is no air flow straightener, and air flow is depicted with dashed grey lines as before: the darker grey indicates a greater velocity of air. In the illustrated embodiment, air flow velocity increases in the narrower region between the fans and the modules, as described previously. Air flow may include undesirable nonuniformities in the illustrated embodiment.

Figure 12B:
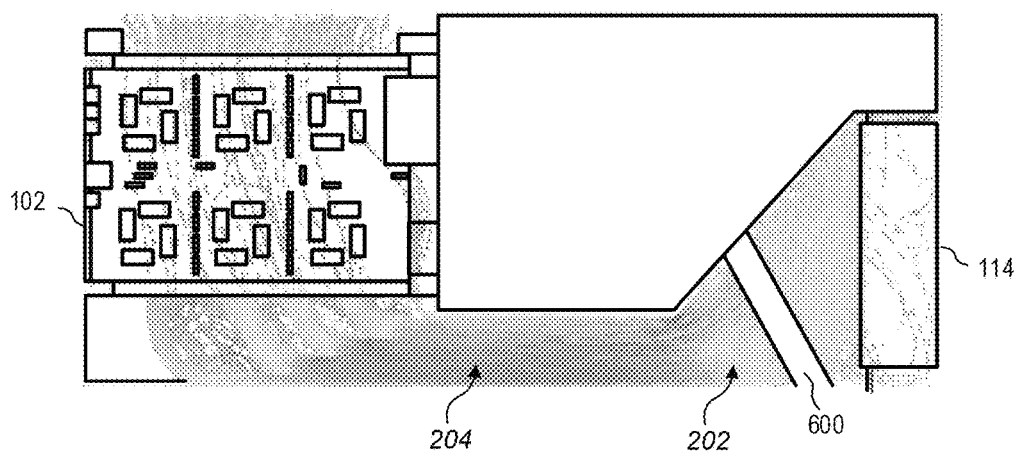
FIG. 12B is a diagram illustrating a cross section of air flow through a chassis including an air flow straightener from a side view, according to some embodiments.

FIG. 12B—Side View of Airflow in Chassis with Straightener

FIG. 12B is a similar illustration to FIG. 12A, but including an airflow straightener. In the illustrated embodiment, the air flow straightener is shown as a blank line in the sloped region of the chassis. The air flow after exiting the fans and prior to entering the air flow straightener may be seen to behave substantially the same as in FIG. 12A. In the illustrated embodiment, the air flow exiting the air flow straightener, in comparison to air flow in the same region of FIG. 12A, may be more uniform in velocity. The air flow may enter the module section of the chassis with smaller nonuniformity than would result without a straightener (e.g., in FIG. 12A).

Figure 13:
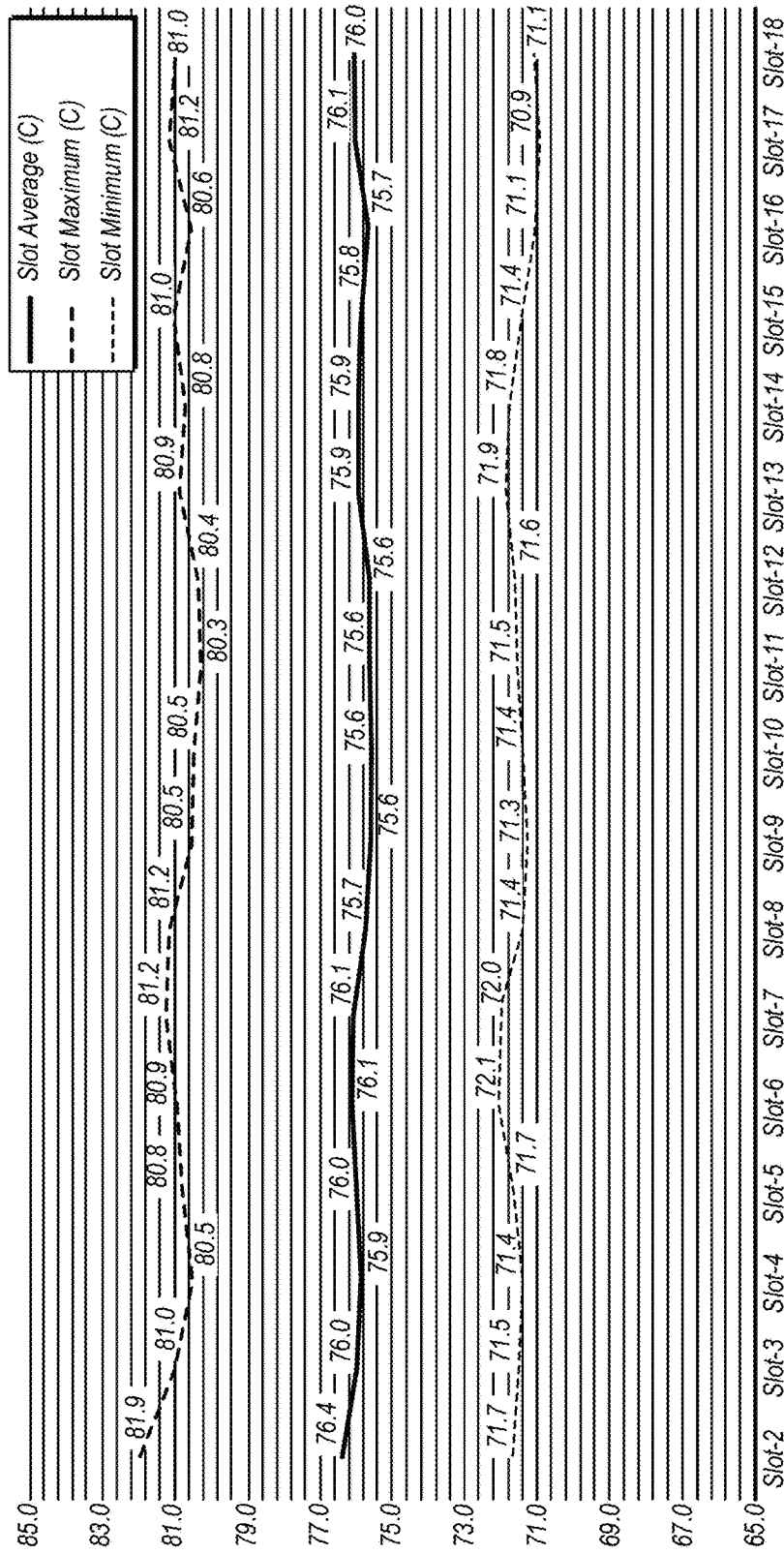
FIG. 13 is a diagram illustrating the variation of temperatures of modules in various slots in a chassis with the inclusion of an air flow straightener, according to some embodiments.

FIG. 13—Temperature Variation with an Airflow Straightener

FIG. 13 illustrates temperature distribution between modules located in different numbered slots with the inclusion of an airflow straightener. FIG. 13 illustrates substantially less variation from one slot to another than is illustrated in FIG. 5. In the illustrated embodiment, the maximum difference in average temperature between two slots is 0.8 degrees Celsius. Some variation in temperatures from slot to slot may be exhibited; in some embodiments, the air flow may not be perfectly evenly distributed. However, as illustrated, inclusion of the airflow straightener has substantially reduced temperature variations between different slots in the chassis. In the illustrated embodiment, the consistent temperature from slot to slot may improve the reliability, performance, or other characteristics of the modules being cooled.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, steps in processes and procedures may admit permutation of order, and certain features of the invention may be utilized independently, all as would be apparent to one skilled in the art after having the benefit of this description of the invention. Changes may be made in the elements described herein without departing from the spirit and scope of the invention as defined in the following claims.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A chassis, comprising:
   two or more electronic devices arranged along a first direction;
   one or more fans, wherein the one or more fans are configured to provide a flow of air through the chassis;
   at least one channel configured to direct the flow of air from the one or more fans to the two or more electronic devices, wherein the at least one channel has at least first and second regions, wherein the first region is larger in cross sectional area than the second region, and wherein the first region comprises a sloped region that compresses the flow of air into the second region;
   at least one grating located in the first region of the at least one channel, wherein the at least one grating is comprised of a plurality of first dividers predominantly oriented along a second direction and arranged along the first direction, and a plurality of second dividers predominantly oriented along the first direction and arranged along the second direction, wherein the first and second dividers are oriented to direct the flow of air, wherein a spacing between adjacent ones of the first dividers is smaller than a spacing between adjacent ones of the second dividers, wherein a depth of the first dividers is oriented along a third direction that is perpendicular to each of the first and second directions, and wherein the third direction is intermediate between a slope of the sloped region and a slope of the second region; and
   wherein the at least one grating is configured to increase uniformity of the flow of air through the at least one channel.

2. The chassis of claim 1, wherein a depth of the grating in the third direction is determined based at least in part on:
   a resultant impedance of the flow of air; and
   a resultant straightening of the flow of air.

3. The chassis of claim 1, wherein the one or more fans are configured to provide the flow of air from outside the chassis into the at least one channel.

4. The chassis of claim 1, wherein the electronic devices comprise PXI or PXIe cards.

5. The chassis of claim 1, wherein at least one of the one or more fans is an axial fan.

6. A method comprising:
   within a chassis, providing, by one or more fans, a flow of air to two or more electronic devices arranged along a first direction through one or more channels, wherein at least one of the one or more channels has at least first and second regions, wherein the first region is larger in cross sectional area than the second region, and wherein the first region comprises a sloped region that compresses the flow of air into the second region;
   directing the flow of air using at least one grating, wherein the at least one grating is located in the first region, wherein the at least one grating is comprised of a plurality of first dividers predominantly oriented along a second direction and arranged along the first direction, and a plurality of second dividers predominantly oriented along the first direction and arranged along the second direction, wherein the first and second dividers are oriented to direct the flow of air, wherein a spacing between adjacent ones of the first dividers is smaller than a spacing between adjacent ones of the second dividers, wherein a depth of the first dividers is oriented along a third direction that is perpendicular to each of the first and second directions, and wherein the third direction is intermediate between a slope of the sloped region and a slope of the second region.

7. The method of claim 6, wherein the at least one grating is located a distance away from the one or more fans, wherein the distance is determined based at least in part on:
   a resultant impedance of the flow of air; and
   a resultant straightening of the flow of air.

8. The method of claim 6, wherein the at least one grating is configured to be removable from the chassis.

9. The method of claim 6, wherein the at least one grating is configured to increase uniformity of the flow of air through the at least one channel.

* * * * *

UNITED STATES PATENT AND TRADEMARK OFFICE
CERTIFICATE OF CORRECTION

PATENT NO. : 10,219,405 B2
APPLICATION NO. : 15/645267
DATED : February 26, 2019
INVENTOR(S) : Richard G. Baldwin, Jr. et al.

It is certified that error appears in the above-identified patent and that said Letters Patent is hereby corrected as shown below:

On the Title Page

In Item (74) Attorney, Agent or Firm:
Please delete "Myertons" and substitute --Meyertons--.

Signed and Sealed this
Seventh Day of May, 2019

Andrei Iancu
*Director of the United States Patent and Trademark Office*